(12) United States Patent
Lai et al.

(10) Patent No.: US 11,557,444 B2
(45) Date of Patent: *Jan. 17, 2023

(54) KEYBOARD KEY SWITCHES

(71) Applicant: Hewlett-Packard Development Company, L.P., Spring, TX (US)

(72) Inventors: Jian-Cheng Lai, Taoyuan (CN); Wei-Min Liang, Hsinchu (CN); Kuo Shou Yu, Taoyuan (CN)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,277

(22) Filed: Jun. 8, 2020

(65) Prior Publication Data

US 2021/0383986 A1 Dec. 9, 2021

Related U.S. Application Data

(63) Continuation-in-part of application No. 16/892,809, filed on Jun. 4, 2020, now abandoned.

(51) Int. Cl.
*H01H 13/04* (2006.01)
*H01H 13/14* (2006.01)
(Continued)

(52) U.S. Cl.
CPC ............ *H01H 13/14* (2013.01); *G01D 5/342* (2013.01); *H03K 17/943* (2013.01); *H01H 13/04* (2013.01); *H01H 13/7073* (2013.01)

(58) Field of Classification Search
CPC ........ H01H 13/14; H01H 13/04; H01H 13/20; H01H 13/7073; H01H 13/83; H01H 13/06;
(Continued)

(56) References Cited

U.S. PATENT DOCUMENTS 4,479,040 A 10/1984 Denley et al.
4,479,111 A * 10/1984 Madsen ............... H03K 17/969
200/345
(Continued)

FOREIGN PATENT DOCUMENTS

CN 101398553 A 4/2009
CN 102903346 A 1/2013
(Continued)

OTHER PUBLICATIONS

Translation of CN204441139 (Original document published Jul. 1, 2015) (Year: 2015).*

*Primary Examiner* — William A Bolton
(74) *Attorney, Agent, or Firm* — Quarles & Brady LLP

(57) ABSTRACT

Key switches of the inventive subject matter are designed to give users the tactile feel of key switches from expensive mechanical keyboards without drawback typically associated with alternative key switches. In some embodiments, key switches described in this application are designed to function with a sheet of membrane switches, while in other embodiments, key switches of the inventive subject matter incorporate optical switching in place of membrane switching. Embodiments for use with membrane switching feature a plunger and rocker combination that prevents the pressure from a user's key press from being directly transferred to a membrane switch, thereby reducing wear and tear. In optical switching embodiments, pressing the key switch causes an actuator, e.g., come between an optical emitter/receiver pair to register a key press.

20 Claims, 10 Drawing Sheets

(51) Int. Cl.
*H01H 13/7073* (2006.01)
*G01D 5/34* (2006.01)
*H03K 17/94* (2006.01)

(58) Field of Classification Search
CPC ...... H01H 13/52; H01H 13/70; H01H 13/705;
H01H 13/84; H01H 13/85; H01H 13/86;
H03K 17/943; G01D 5/342
USPC .......... 200/231, 5 A, 50.36, 51.16, 412, 417,
200/422, 453, 276.1, 277.1, 314, 341,
200/520, 517, 344, 345, 502, 521;
250/229; 345/168
See application file for complete search history.

(56) References Cited

U.S. PATENT DOCUMENTS

| | | | |
|---|---|---|---|
| 4,490,731 A | 12/1984 | Vaught | |
| 4,553,009 A * | 11/1985 | Van Zeeland | H01H 13/705 200/517 |
| 4,803,362 A * | 2/1989 | Butts | H01H 13/50 250/229 |
| 4,939,327 A | 7/1990 | Wu et al. | |
| 4,990,731 A | 2/1991 | Wu et al. | |
| 5,095,181 A | 3/1992 | Osika et al. | |
| 6,812,421 B2 | 11/2004 | Sato et al. | |
| 6,878,894 B2 * | 4/2005 | Schwarz | H01H 15/107 200/341 |
| 7,122,756 B2 | 10/2006 | Sasaki et al. | |
| 7,982,716 B2 * | 7/2011 | Bowen | G06F 3/0202 345/168 |
| 8,203,091 B2 * | 6/2012 | Kang | H05K 3/325 200/314 |
| 8,383,976 B2 * | 2/2013 | Hu | H01H 13/023 200/534 |
| 9,646,786 B1 * | 5/2017 | Feng | H01H 36/0073 |
| 9,728,350 B2 | 8/2017 | Muller | |
| 9,952,682 B2 * | 4/2018 | Zhang | G06F 3/0202 |
| 10,102,987 B1 | 10/2018 | Alexander et al. | |
| 10,585,493 B2 | 3/2020 | Elias | |
| 2009/0231253 A1 | 9/2009 | Hu | |
| 2016/0071662 A1 * | 3/2016 | Cai | H01H 13/14 200/314 |
| 2017/0092443 A1 | 3/2017 | Yoshimatsu | |
| 2017/0169967 A1 * | 6/2017 | Chen | H03K 17/968 |
| 2017/0294276 A1 | 10/2017 | Liu | |

FOREIGN PATENT DOCUMENTS

| | | |
|---|---|---|
| CN | 103067726 A | 4/2013 |
| CN | 204441139 U | 7/2015 |
| CN | 106571257 B | 4/2017 |
| CN | 107610966 A | 1/2018 |
| CN | 108231467 A | 6/2018 |
| JP | 61-162917 U | 10/1986 |
| JP | 2008-020611 A | 1/2008 |
| TW | 201931408 A | 8/2019 |
| WO | WO2019196611 A1 | 10/2019 |

* cited by examiner

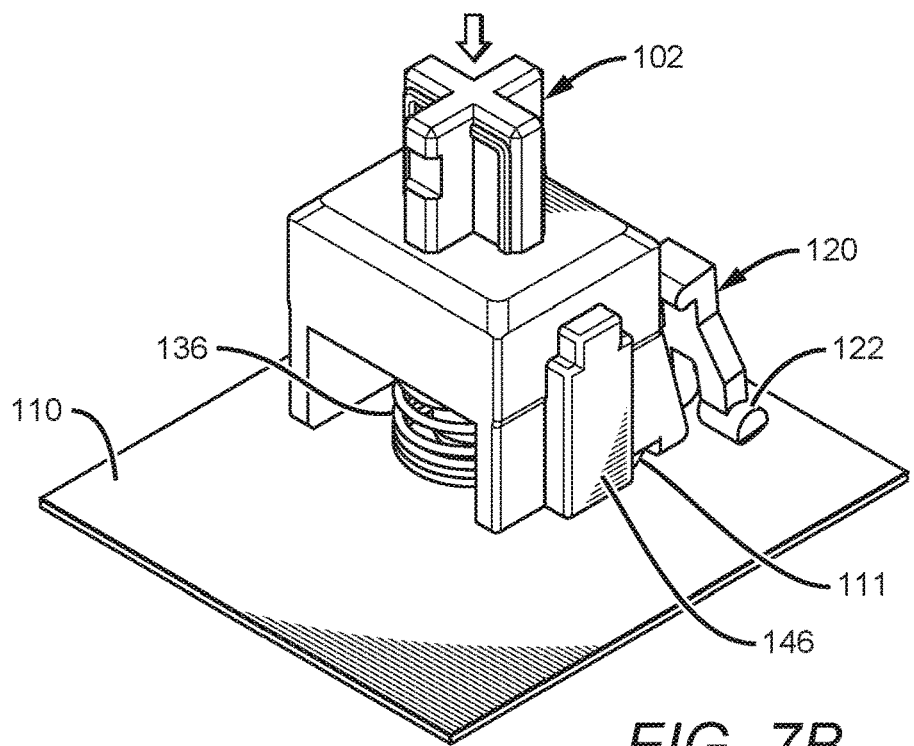
FIG. 7B
FIG. 8
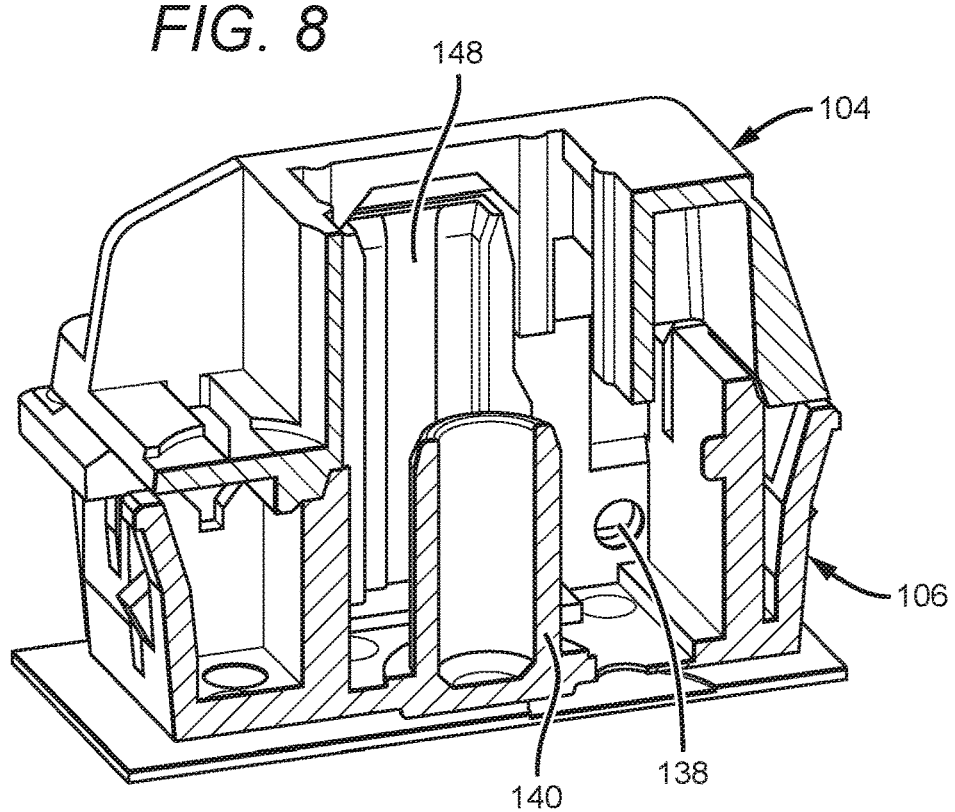

KEYBOARD KEY SWITCHES

This application is a continuation-in-part and claims priority to U.S. patent application Ser. No. 16/892,809 filed Jun. 4, 2020. All extrinsic materials identified in this application are incorporated by reference in their entirety.

FIELD OF THE INVENTION

The field of the invention is key switches for keyboards.

BACKGROUND

The background description includes information that may be useful in understanding the present invention. It is not an admission that any of the information provided in this application is prior art or relevant to the presently claimed invention, or that any publication specifically or implicitly referenced is prior art.

Early keyboards were known, in part, for the sound the keys made when pressed. The recognizable clicking was the result of each key being configured as an actual physical switch that, when actuated, resulted in creating an electrical signal or closing/opening a circuit that a computer interpreted as a key press. Because these early keyboards used mechanical switching, they had a distinct feel associated with the force required for each key to register a keypress. As keyboards evolved, newer technology began to replace these old mechanical keyboards, resulting in the loss of the look and feel of the original mechanical keyboards.

One technology that reduced keyboard cost and helped moved the industry away from mechanical keyboards was the membrane switch. With membrane switches, keyboards could be lower profile, have keys that could be actuated with less force and less travel, and they were much cheaper. But computing—and especially gaming—enthusiasts have often preferred the feel and sound of a mechanical keyboard, not to mention the reliability. Now, more than just enthusiasts choose mechanical keyboards. Today, an entire industry exists to serve these once-niche groups. But mechanical keyboards remain more expensive than membrane switch-based keyboards, and because membrane switches are more prone to wear and tear, a mechanical key switch that actuates a membrane switch must isolate the force of a key press from transferring to the membrane. A need has therefore arisen for a membrane switch-based keyboard having the sound, feel, and reliability of a mechanical keyboard.

Some efforts have been made to improve key switches, but these all fall short in accurately replicating the feel of a mechanical key switch while benefiting from the use of inexpensive membrane switches. For example, International Application WO2019196611A1 discloses a keyboard with a mechanical key switch with an associated membrane. The '611 application features a shaft disposed within a plunger, where the shaft is coupled with the plunger by a spring, thus separating the force of a user's key press from directly impacting the membrane switch. Although this application does control some of the force that is applied to the membrane switch, its configuration does not fully isolate the force of a user's key press from the membrane, resulting in force applied to the membrane from being inconsistent, which results in unnecessary wear and tear. The '611 application thus discloses a key switch that does not allow for precise control over how much pressure is applied to the membrane, and is incapable of causing the same force to be applied regardless of how hard or fast a user presses a key.

This and all other extrinsic materials discussed in this application are incorporated by reference in their entirety. Where a definition or use of a term in an incorporated reference is inconsistent or contrary to the definition of that term provided in this application, the definition of that term provided in this application applies and the definition of that term in the reference does not apply.

It has yet to be appreciated that key switches can be designed to benefit from membrane switching without sacrificing reliability, feel, or sound that are hallmark of true mechanical key switches. Thus, there is still a need in the art for improved key switches.

SUMMARY OF THE INVENTION

The present invention provides systems and methods directed to key switches for use in keyboards. In one aspect of the inventive subject matter, a key switch is contemplated to include: a lower casing having an actuator hole through a bottom portion; an optical emitter and an optical receiver disposed on either side of the actuator hole; an upper casing having a plunger hole through a top portion and configured to couple with the lower casing to form an interior space; a plunger comprising a sloped surface, where the plunger movably couples with the lower casing; a rocker disposed within the interior space, where the rocker is configured to pivot about two pivot points that couple with the lower casing. The rocker also has a hammer disposed on a first portion of the rocker and an actuator disposed on a second portion of the rocker, where the first portion of the rocker exists on a first side of the first and second pivot points and where the second portion of the rocker exists on a second side of the first and second pivot points. The key switch includes a spring disposed between the lower casing and the rocker that is configured to press the hammer against the sloped surface such that, upon depressing the plunger at least partially into the interior space, the rocker rotates about the pivot points based on the hammer sliding along the sloped surface causing the actuator to come between the optical emitter and the optical receiver.

In some embodiments, the actuator extends through the actuator hole upon depressing the plunger. The plunger can include an upper portion having a cross-shaped cross section to facilitate coupling a key cap thereto. In some embodiments, the plunger includes a piston and the lower casing includes a piston cavity. The piston is thus configured to fit at least partially within the piston cavity such that the piston cavity acts as a guide for the piston's movement when a user presses a key. The key switch can also include a second spring between the lower casing and the plunger, where the piston and the piston cavity are disposed at least partially within an interior portion of the second spring.

In another aspect of the inventive subject matter, a key switch is contemplated as including: a casing having an actuator hole through a bottom surface; an optical emitter and an optical receiver disposed on either side of the actuator hole; a plunger comprising a sloped surface, where the plunger movably couples with the casing; and a rocker at least partially disposed within the casing. The rocker includes a hammer disposed on a first portion and an actuator on a second portion. The key switch also includes a spring between the casing and the rocker, where the spring is configured to press the hammer against the sloped surface. When the plunger is depressed at least partially into the interior space (e.g., a user presses a key at least partially down), the rocker is configured to rotate based on an interaction of the hammer with the sloped surface causing the actuator to come between the optical emitter and the optical receiver.

In some embodiments, the actuator extends through the actuator hole upon depressing the plunger. The plunger can include an upper portion having a cross-shaped cross section to facilitate coupling a key cap thereto. In some embodiments, the plunger has a piston and the casing has a piston cavity, and the piston is configured to fit at least partially within the piston cavity such that the piston cavity acts as a guide for the piston's movement. The key switch can also include a second spring disposed between the casing and the plunger, where the piston and the piston cavity are disposed at least partially within an interior portion of the second spring.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWING

FIG. 7B is a front perspective view of the internal components with the plunger depressed.

FIG. 8 is a rear perspective cutaway view of the upper and lower casing without the internal components shown.

DETAILED DESCRIPTION

Figure 1A:
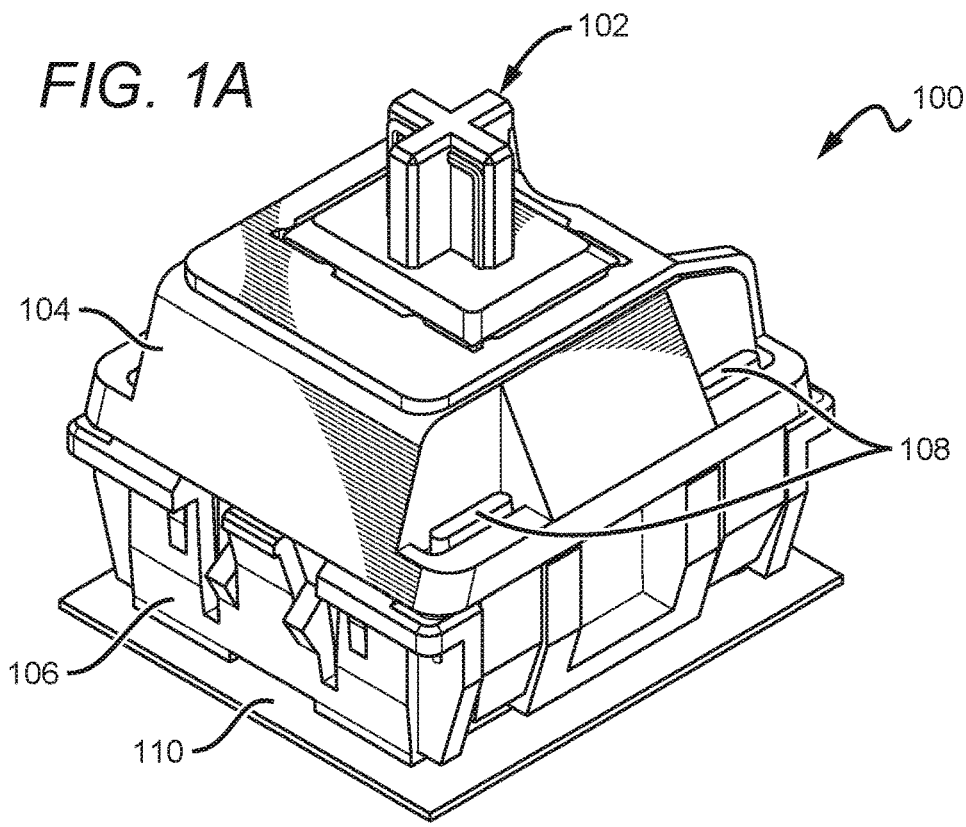
FIG. 1A is a front perspective view of a key switch embodiment with its plunger undepressed.

The following discussion provides example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

As used in the description in this application and throughout the claims that follow, the meaning of "a," "an," and "the" includes plural reference unless the context clearly dictates otherwise. Also, as used in the description in this application, the meaning of "in" includes "in" and "on" unless the context clearly dictates otherwise.

Also, as used in this application, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements. Moreover, and unless the context dictates the contrary, all ranges set forth in this application should be interpreted as being inclusive of their endpoints and open-ended ranges should be interpreted to include only commercially practical values. Similarly, all lists of values should be considered as inclusive of intermediate values unless the context indicates the contrary.

The inventive subject matter is directed to keyboard switches (also referred to as key switches) that are configured for use with a sheet of membrane switches disposed below them. Mechanical keyboards are desirable for a variety of reasons, including how the keys feel when they are pressed. This feel comes from the nature of those switches: key switches in traditional mechanical keyboards feature mechanical switches therein, and when a key switch is actuated (by, e.g., a key press), the switch is actuated and a key is registered by a computer as being pressed. Mechanical keyboards are often used by gamers, and small enthusiast communities have created the space for an entire market segment. But creating a keyboard using mechanical key switches results in an expensive keyboard. Key switches of the inventive subject matter forego the inclusion of an actual switch built into each key switch and is instead configured to actuate a membrane switch. This configuration results in a less expensive key switch that has the same feel as a mechanical key switch.

FIG. 1A shows a key switch 100 of the inventive subject matter with the plunger 102 in its undepressed resting position. Plunger 102 is disposed within a housing made from an upper casing 104 and a lower casing 106. Lower casing 106 features tabs 108 that fit into slots in the upper casing 104 (e.g., the slots shown in FIGS. 1A & 1B). When the casings 104 and 106 are coupled together, they form a slot for plunger 102 to depress into.

Figure 1B:
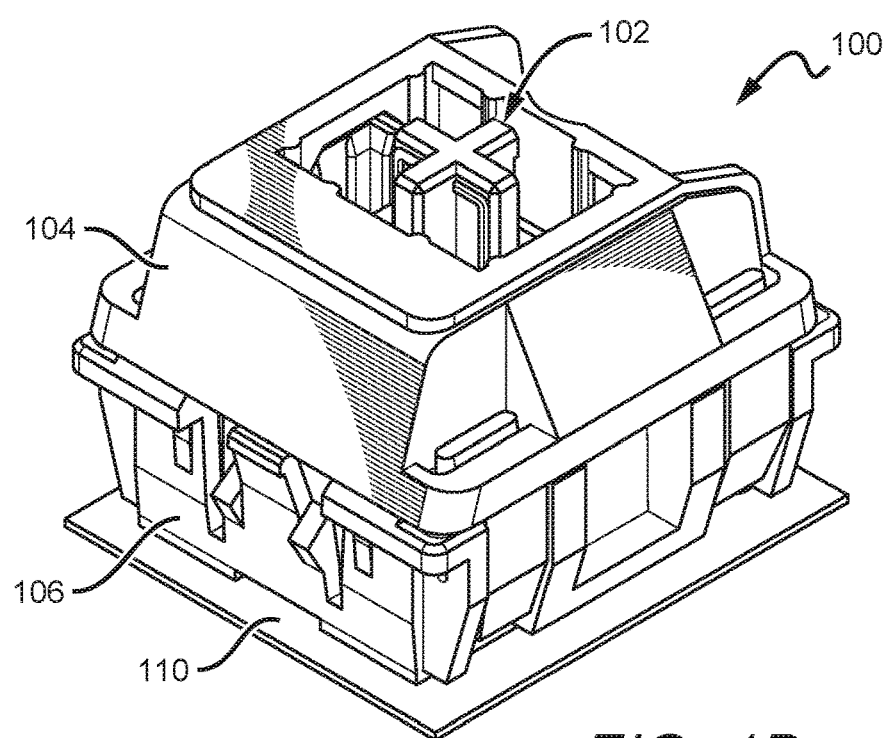
FIG. 1B is a front perspective view of a key switch embodiment with its plunger depressed.

FIG. 1B shows the key switch 100 with the plunger 102 depressed. Plunger 102 features a cross-shaped protrusion that is designed according to industry standard for keycaps, where one of the cross members features notch (visible in FIGS. 2A and 2B). Keycaps (e.g., the portion of a keyboard that a user presses to actuate a key switch) feature a cross-shaped intrusion on their undersides so that the keycaps can be coupled with a key switch (key caps essentially click onto the cross-shaped protrusion). The upper casing 104 features a non-circular cutout for the plunger 102 so that the plunger 102 cannot freely rotate within the casings. This ensures keycaps remain properly oriented on an assembled keyboard. Finally, a membrane 110 comprising a plurality of membrane switches (e.g., a switch below each key switch) is shown below the key switch 100. In an assembled keyboard, the membrane would include as many switches as there are key switches in the keyboard that the key switches are implemented in.

Figure 2A:
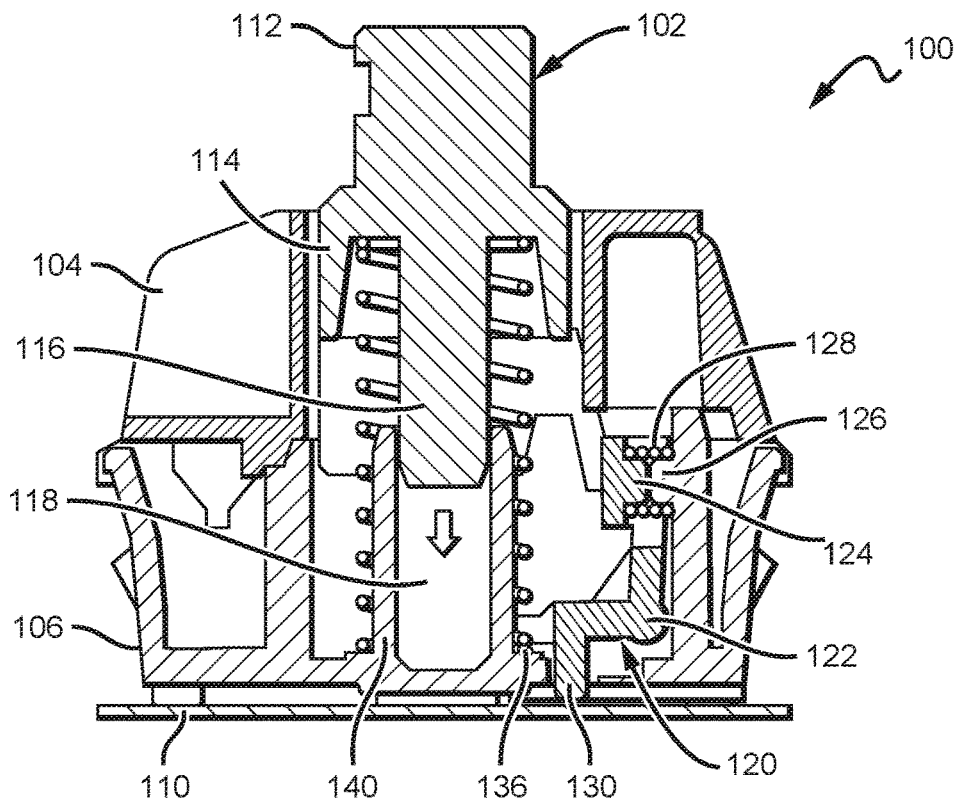
FIG. 2A is a side cutaway view of the key switch embodiment with its plunger undepressed.

FIG. 2A shows a side cutaway view of key switch 100, showing a profile view of the internal components. As mentioned above, plunger 102 features a cross-shaped upper protrusion 112. Below the protrusion 112 is a cup-shaped flared portion 114, where the opening of the cup faces downward. The flared portion (the portion that the protrusion 112 protrudes from) is sized and dimensioned to fit within the opening in the top of the upper casing 104. The cup portion faces downward therefrom and features a piston 116 that extends downward from the middle of the cup portion. As shown in FIG. 2A, when the plunger 102 is undepressed, piston 116 fits partially into piston cavity 118. An arrow drawn inside piston cavity 118 indicates that, upon a key press, the piston 116 (and the entire plunger component) moves downward such that the piston 116 fills more of the piston cavity 118 as shown in FIG. 2B.

Figure 2B:
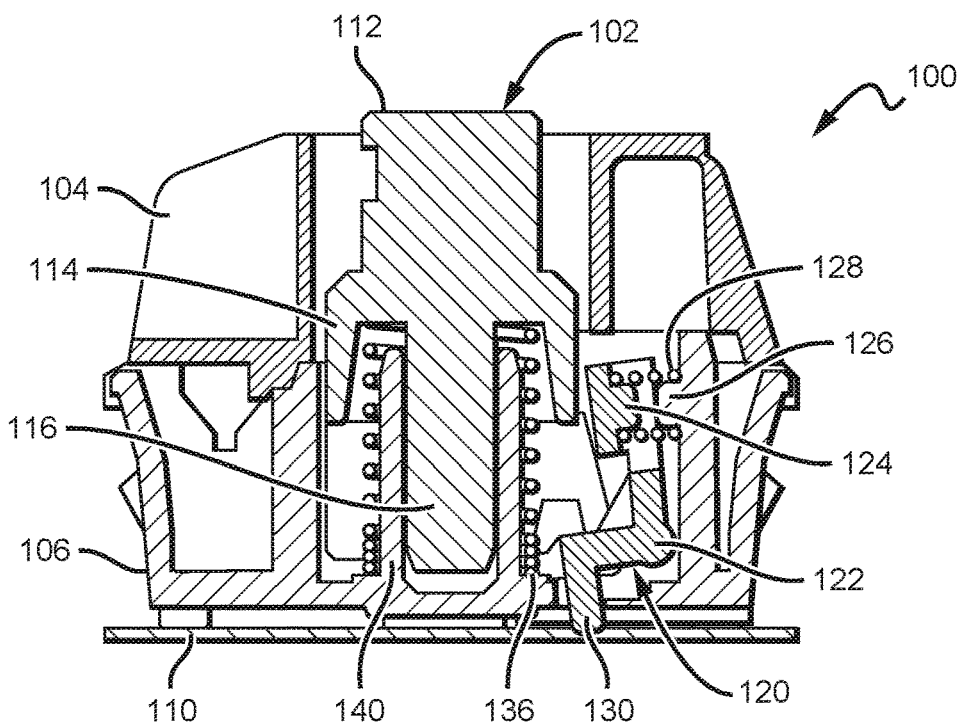
FIG. 2B is a side cutaway view of the key switch embodiment with its plunger depressed.
Figure 3A:
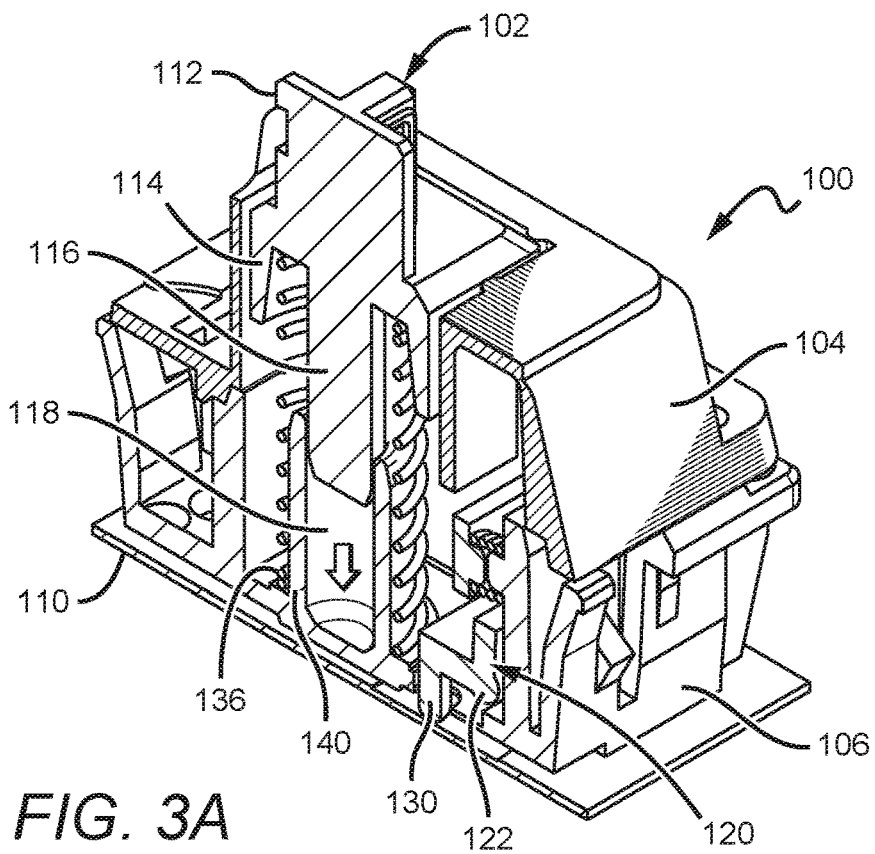
FIG. 3A is a cutaway view of the key switch embodiment with its plunger undepressed.
Figure 3B:
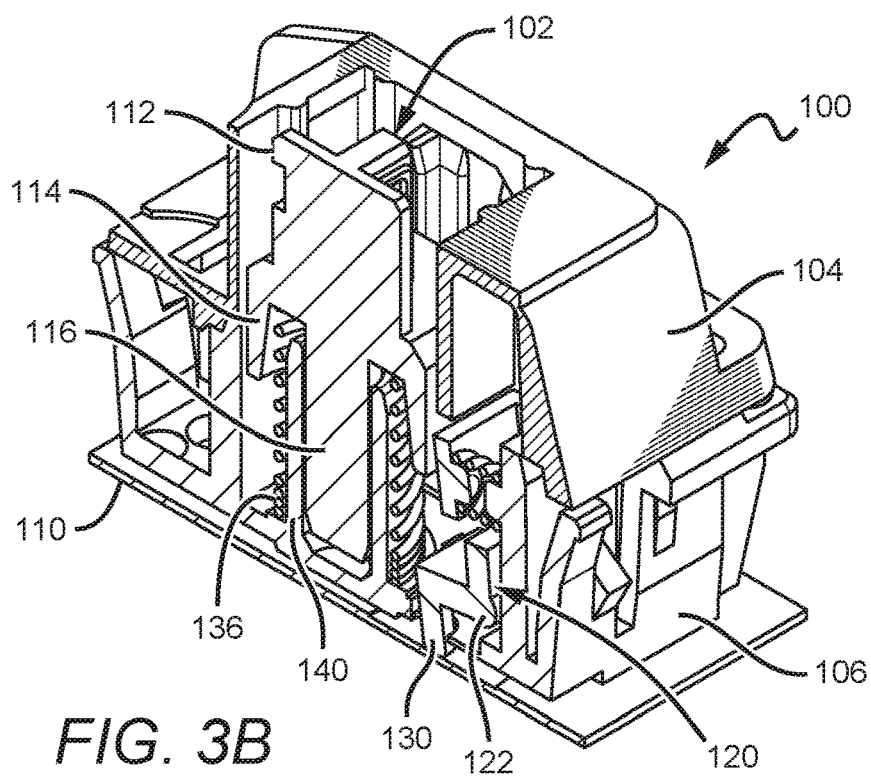
FIG. 3B is a cutaway view of the key switch embodiment with its plunger depressed.

Also shown in FIGS. 2A and 2B is a rocker 120. Rocker 120 is disposed within the key casings 104 & 106, and it is configured to rotate about pivot point 122 (there are two pivot points per rocker, both of which are designated as 122 in this application). The upper portion of the rocker 120 features a rocker protrusion 124 that, when the key switch is in an undepressed configuration, contacts (or come close to contacting) a corresponding casing protrusion 124. Rocker protrusion 124 and casing protrusion 126 are configured such that, for example, a coil spring disposed between the rocker and the lower casing 106, where the spring 128 has an inner diameter that is larger than the greatest width measurement of the protrusions 124 & 126. Other types of springs are also contemplated, including a torsion spring configured to press the rocker 120 toward the center of the key switch. Protrusions 124 & 126 can have a circular cross section (e.g., to match the circular nature of ordinary coil springs), but such a configuration is not necessary so long as they are formed in such a way a coil spring is held in place when put into position between the rocker 120 and the lower casing 106. FIGS. 3A and 3B show the cutaway views in FIGS. 2A and 2B from a perspective view. These views make it easier to see the shapes and configurations of different components that may be more difficult to see in a side view.

Rocker 120 additionally features an actuator 130, is coupled with a bottom portion of the rocker 120 and configured to protrude through a hole in the bottom of the lower casing 106. In FIG. 2A, actuator 130 is at its initial position (e.g., there is space between the actuator 130 and the membrane 110). FIG. 2B, on the other hand, shows the rocker 120 in a second position that occurs when a user presses on the key switch. Thus, the actuator 130 presses against the membrane 110 on a switching portion of the membrane 110, causing, e.g., a computer to register that a key has been pressed.

Figure 4A:
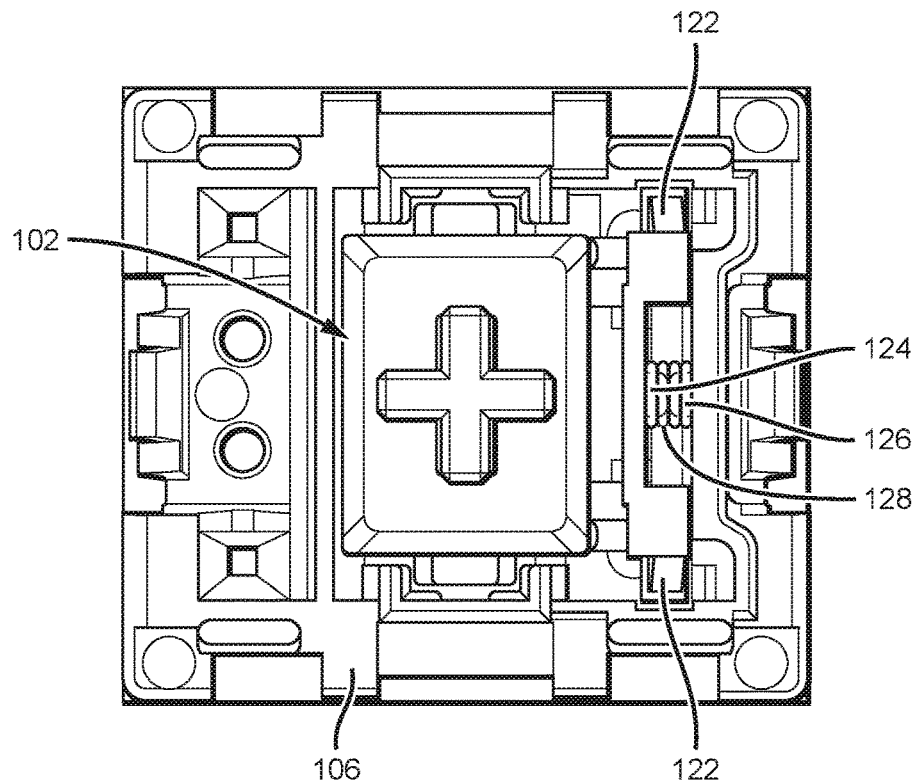
FIG. 4A is a top view of the key switch embodiment with its plunger undepressed.
Figure 4B:
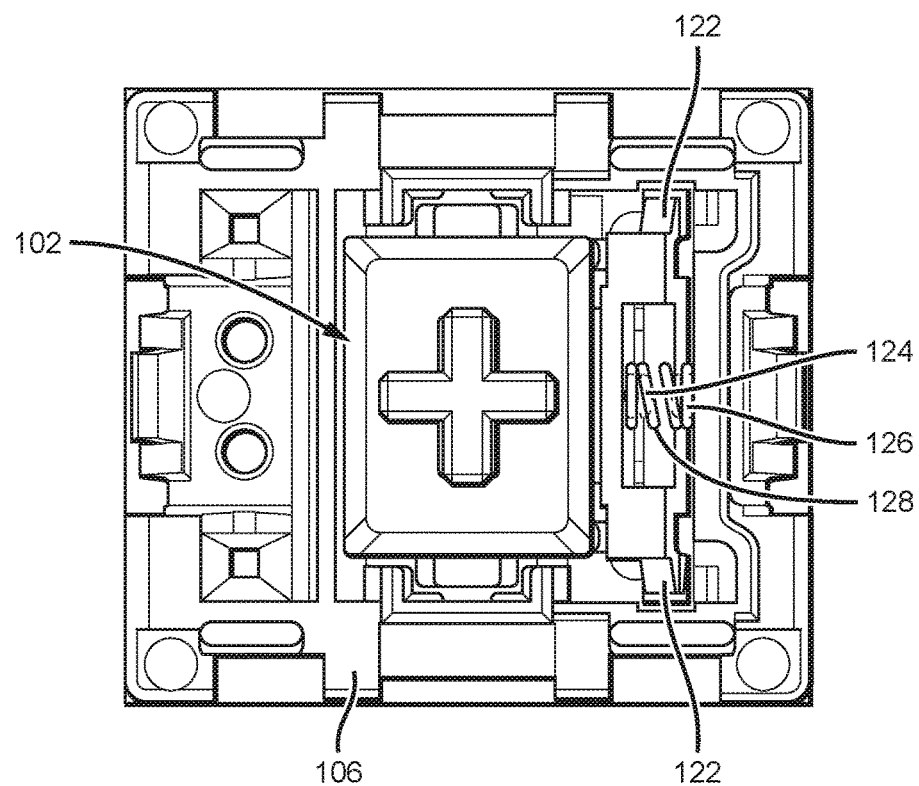
FIG. 4B is a top view of the key switch embodiment with its plunger depressed.

FIGS. 4A and 4B show a top view of the key switch 100 with the upper casing removed. FIG. 4A shows the key switch 100 in an undepressed position, while FIG. 4B shows the key switch 100 in a depressed position. Protrusions 124 and 126 are shown to move apart from one another between FIGS. 4A and 4B as the plunger 102 is depressed. Spring 128 causes protrusion 124 to move away from protrusion 126 as the plunger 102 is depressed.

Figure 5A:
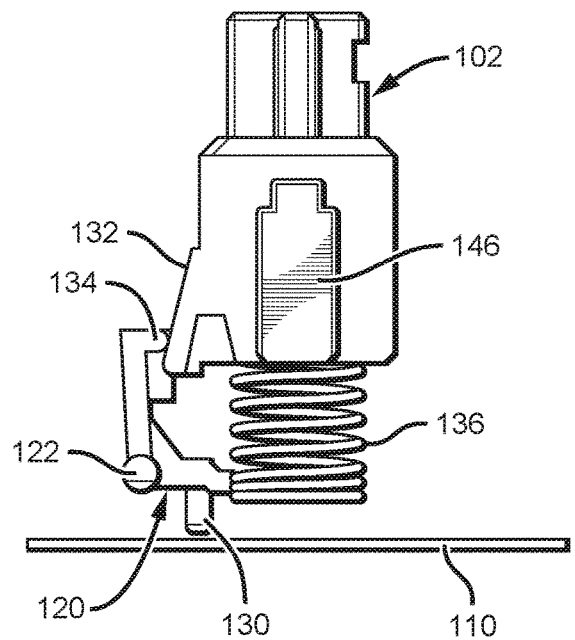
FIG. 5A is a side view of the key switch embodiment without the upper casing with its plunger undepressed.
Figure 5B:
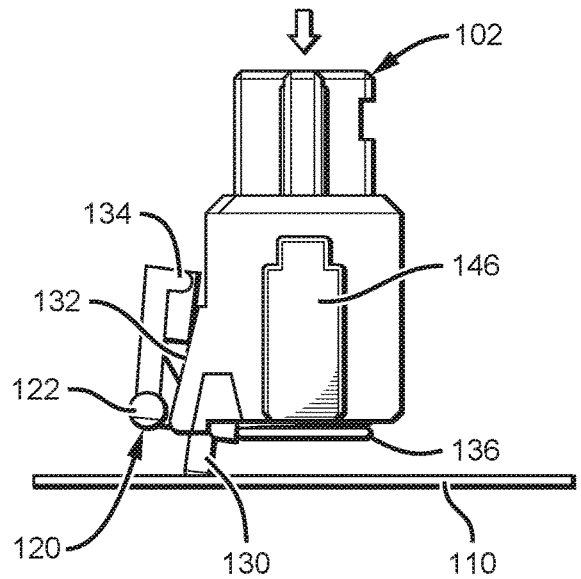
FIG. 5B is a side view of the key switch embodiment without the upper casing with its plunger depressed.

The mechanics behind movement of rocker 120 are best seen in FIGS. 5A and 5B, which show key switch 100 without the upper casing 104 or the lower casing 106. Plunger 102 features a sloped surface 132 that is positioned to interact with hammer 134 on rocker 120. At rest, as shown in FIG. 5A, hammer 134 rests against sloped surface 132 near a bottom portion. As plunger 102 moves downward, hammer 134 slides along sloped surface 132, where hammer 134 is pressed against the sloped surface 132 by spring 128 (shown in previous figures). Hammer 134 slides along the sloped surface 132 as the plunger 102 is depressed, causing rotation of the rocker about pivot point 122. Pivot point 122 comprises an extrusion on each side of rocker 120 that couple with the lower casing 106 at two coupling points (e.g., intrusions that are sized and dimensioned such that both pivot points can be disposed therein upon assembly). Both pivot points 122 can be seen in FIGS. 4A and 4B, which show the rocker 120 coupled with the lower casing 106. One such coupling point—coupling hole 138—is shown in FIG. 8, which shows the upper and lower casings 104 & 106 without any internal components disposed therein.

Movement of plunger 102 is resisted by spring 136, which exerts an upward reactive force against the plunger 102 when it is depressed according to the down arrow shown in FIG. 5B. Spring 136 is sized and dimensioned such that its inner diameter is larger than an outer diameter of piston 116. In some embodiments, piston 116 is not formed with a circular cross-section, and can be formed to have, e.g., a cross-shaped cross section, or some other cross section where the longest measurement across that cross section is less than the inner diameter of spring 136. Piston 116 has at least two purposes: it helps hold spring 136 in position when it is compressed or allowed to decompress, and it also acts as a guidepost for plunger 102. It helps to prevent plunger 102 from wobbling as it is depressed, ensuring that plunger 102 moves up and down along a single, vertical axis of movement.

Hollow protrusion 140 also cooperates with spring 136 as well as piston 116. Hollow protrusion 140 can be seen in FIGS. 2A-3B and FIG. 8. Piston 116, which is described as having an outer diameter (or, in some embodiments, largest width dimension) that is less than the inner diameter of spring 136, must also have an outer diameter that is smaller than the inner diameter of the hollow protrusion 140. Thus, as plunger 102 is depressed, piston 116 moves into hollow protrusion 140, which guides movement of the plunger, ensuring movement is restricted to up and down movement. Hollow protrusion 140 has an outer diameter that is smaller than the inner diameter of spring 136 so that spring 136 can be disposed around the both the hollow protrusion 140 and the piston 116. This configuration can be seen in, e.g., FIGS. 2A-3B.

Put together, key switches of the inventive subject matter prevent pressure from a user's finger from directly translating to a membrane, thereby reducing membrane wear and tear and increasing keyboard longevity. Instead, force from spring 128 causes rocker 120 to rotate such that its actuator 130 presses into a switching portion of the membrane 110. The pressure applied to the membrane 110 will not be impacted by how hard a user presses a key, and key switch force response that a user experiences is controlled by spring 136. Because spring 128 creates the force that is transferred to membrane 110 switch upon depressing plunger 102, spring 128 can thus be configured (e.g., its wire diameter, length, material, etc. can be deliberately selected) so that it creates a desired force that the rocker applies to the membrane 110.

Figure 6A:
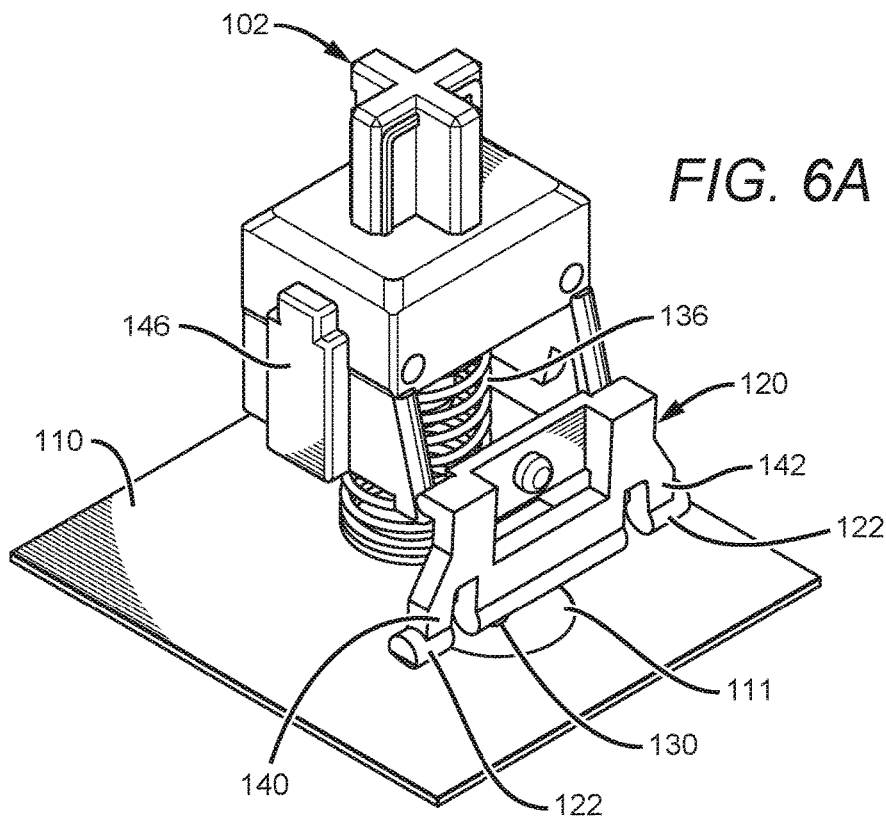
FIG. 6A is a rear perspective view of the internal components with the plunger undepressed.
Figure 6B:
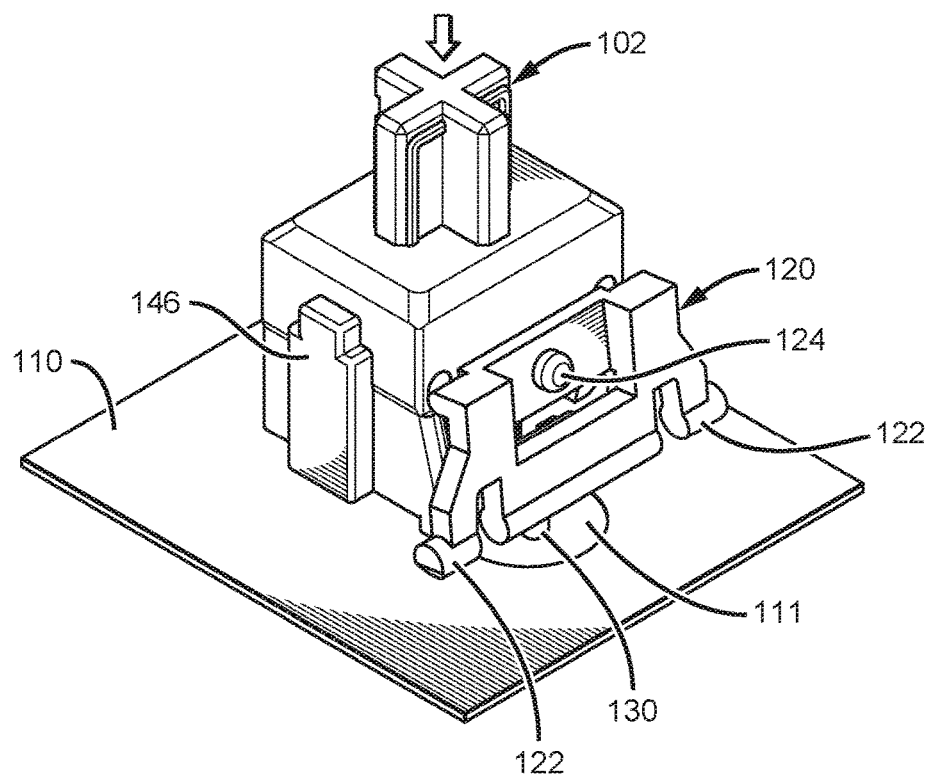
FIG. 6B is a rear perspective view of the internal components with the plunger depressed.

FIG. 6A shows plunger 102 and rocker 120 before the plunger 102 is depressed, and FIG. 6B shows the same components after the plunger 102 is depressed. These views show features of plunger 102 and rocker 120 that might otherwise be more difficult to see in the other figures. For example, pivot points 122 are shown to exist on the ends of two arms 142 & 144. These arms exist to facilitate coupling the rocker 120 with the lower casing 106. To fit pivot points 122 into coupling holes 138 (one of which is shown in FIG. 8, the other being symmetrically disposed on the other side of the lower casing 106, not shown because FIG. 8 shows a cutaway view), arms 142 and 144 are configured to flex inward. When arms 142 and 144 flex inward, pivot points 122 can be fit into coupling holes 138. Once disposed within coupling holes 138, rocker 120 can rotate about pivot point 122.

Figure 7A:
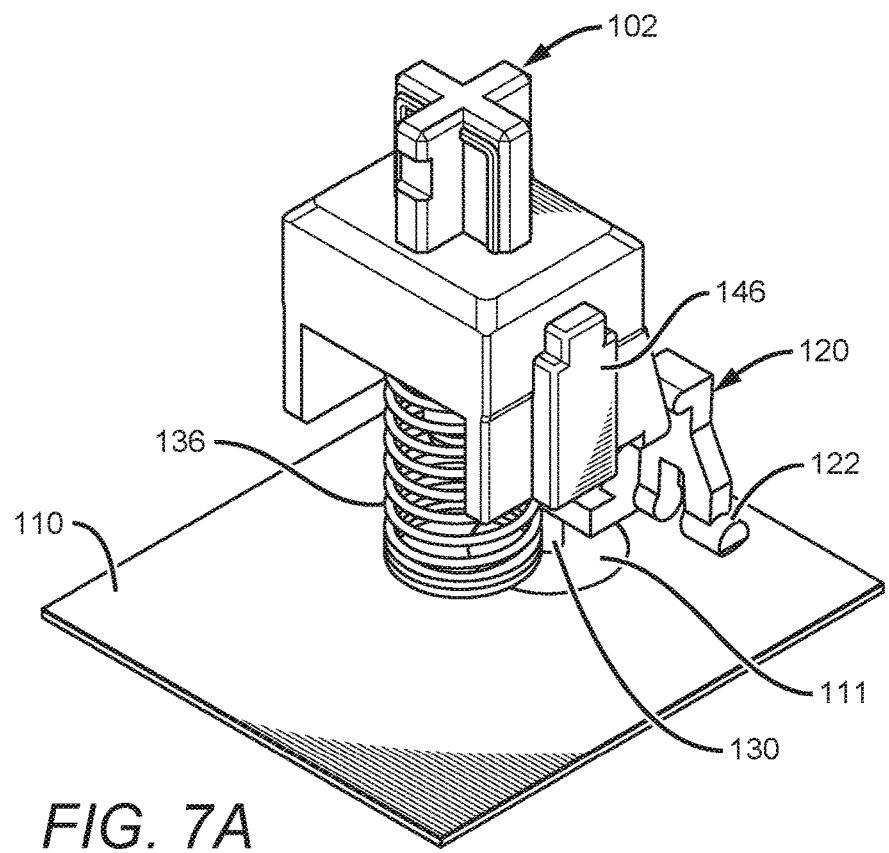
FIG. 7A is a front perspective view of the internal components with the plunger undepressed.

FIGS. 7A and 7B show another view of the internal components of key switch 100, including plunger 102, rocker 120, and spring 136. FIG. 7A, as with FIG. 6A, shows undepressed plunger 102 with rocker 120 in its default position where actuator 130 is not in contact with the membrane 110, while in FIG. 7B, the plunger 102 is shown in a depressed position with the rocker 120 in its rotated position such that actuator 130 comes into contact with the membrane 110. Membrane 110, as seen in various figures, features a circular portion denoting the switching area 111. When actuator 130 contacts switching area 111, the membrane 110 registers a keypress.

FIGS. 7A-7B also show features 146 on the outer surface of the plunger 102 that are configured to prevent plunger 102 from coming out of casings 104 & 106 when the casings are coupled together to form the key switch 100. Features 146 are configured such that the plunger 102 is wider than the hole for the plunger on the upper casing 104 (e.g., the hole through which the top portion of the plunger 102 extends as seen especially in FIGS. 1A and 1B), thereby preventing plunger 102 from coming out the top of the upper casing. Lower casing 106 accordingly include features complementary to features 146. These complementary features comprise slots 148 that extend vertically, where the upper casing 104 overhangs the slots to prevent the plunger 102 from coming out the top of the upper casing 104 as explained above. Although only one slot 148 is shown in FIG. 8, lower casing 106 includes slots on both sides to accommodate both features 146 disposed on the sides of plunger 102.

In addition to the embodiment described above, some embodiments of the inventive subject matter incorporate optical switching instead of membrane switching. FIGS. 9A-10B show such an optical key switch 200. Optical key switches 200 are largely like the embodiments described above. Internal components are similar, with, in some embodiments, differently sized components, though the configuration of the internal components is approximately the same. The biggest difference is that, as plunger 202 is depressed, it causes rocker 204 to rotate, and the actuator 208, instead of pressing against a membrane switch, causes a break between an emitter and sensor combination.

Figure 9A:
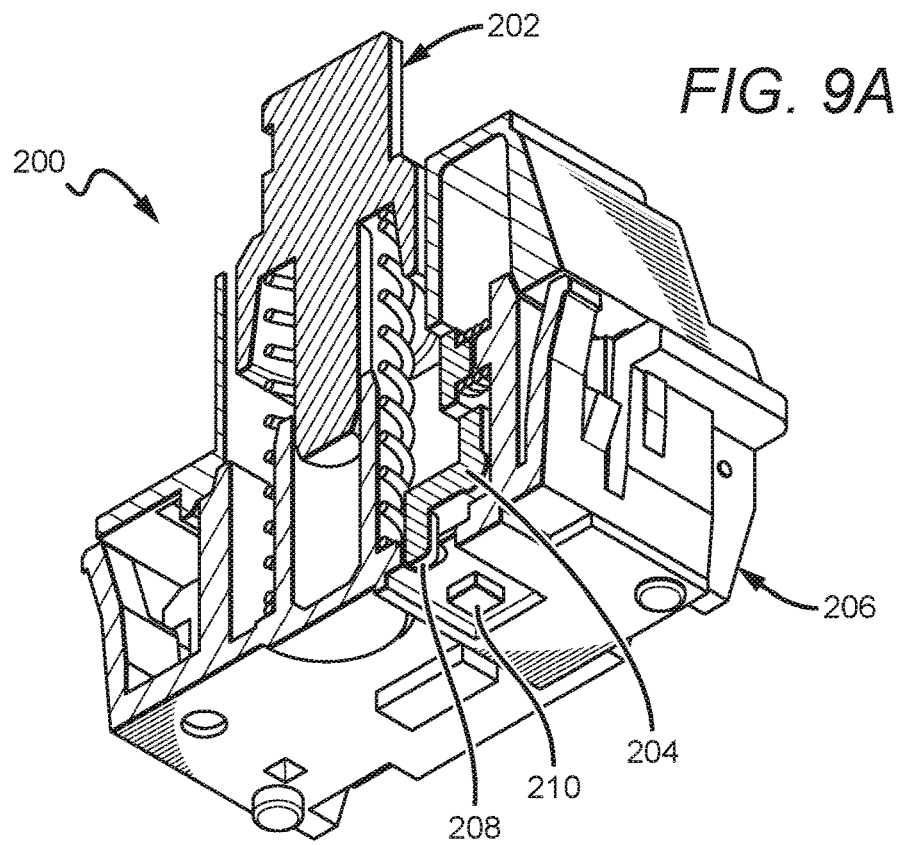
FIG. 9A shows a cutaway view of an optically switched embodiment with the plunger undepressed.

FIG. 9A shows optical key switch 200 with plunger 202 undepressed. As with embodiments described above, having plunger 202 results in the rocker being positioned such that actuator 208 is retracted upward, preventing it from breaking a line of side between an optical emitter/receiver pair. An optical emitter can, e.g., emit radiation in the form of infrared light and an optical receiver can receive that light. If the receiver ceases to receive that light, it can be configured to, e.g., generate an electrical signal that a computer can interpret as a key press. In some embodiments, the receiver ceases to generate a signal when it ceases to receive radiation from the emitter. Other forms of radiation that can be used by the emitter/receiver combination include visible light or any other non-harmful radiation that can be used in such applications.

Because FIG. 9A is a cutaway view, only one of the emitter or receiver is shown. For purposes of describing the figure, the component shown is emitter 210, but the emitter and receiver can be interchanged, such that emitter 210 is a receiver. In some embodiments, emitter 210 (or the receiver as shown in FIGS. 10A and 10B) can be a combination emitter/receiver that is configured to project electromagnetic radiation (e.g., infrared light) such that emitted radiation is reflected back when actuator 208 extends downward outside of lower casing 206.

Figure 9B:
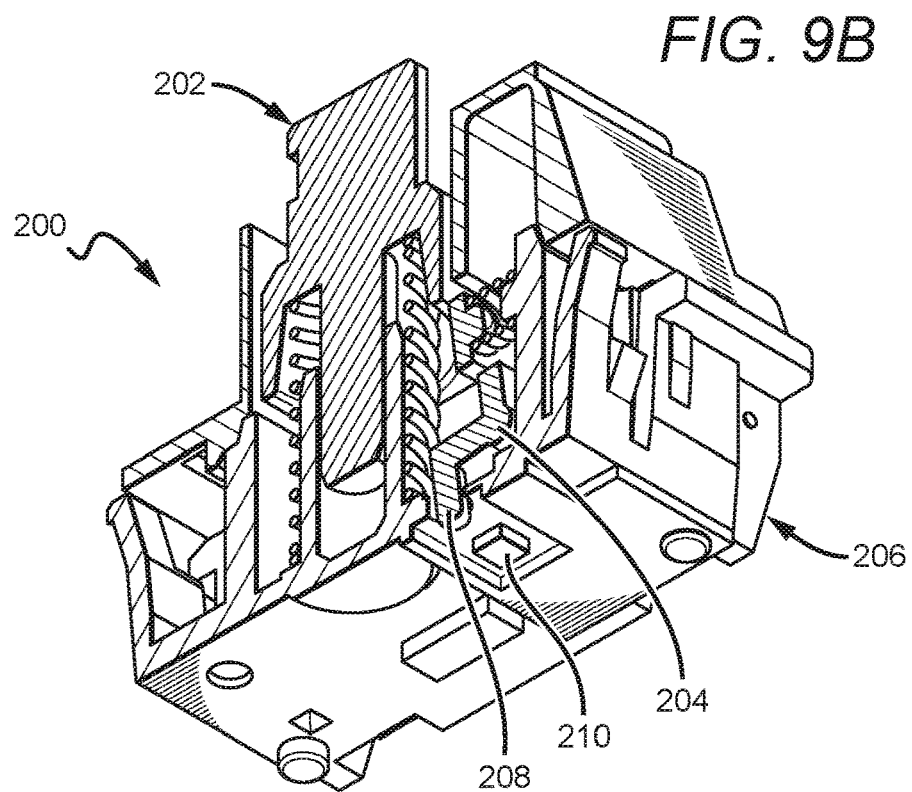
FIG. 9B shows a cutaway view of an optically switched embodiment with the plunger depressed.

FIG. 9B thus shows a cutaway view of key switch 200 when plunger 202 is depressed. Because rocker 204 interacts with plunger 202 in the same way as described above regarding key switch 100, those sections of this application apply equally here to key switch 200. FIG. 9B shows actuator 208 extending below lower casing 206 such that emitter 210 can emit radiation toward it.

Figure 10A:
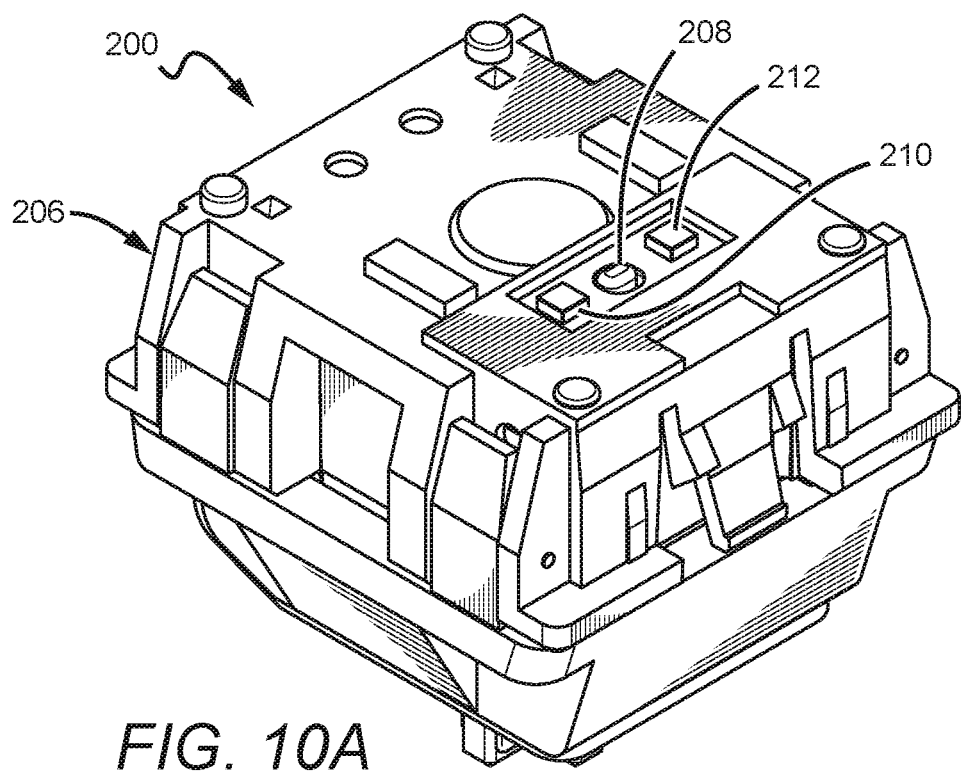
FIG. 10A shows a bottom perspective view of an optically switched embodiment with the plunger undepressed.
Figure 10B:
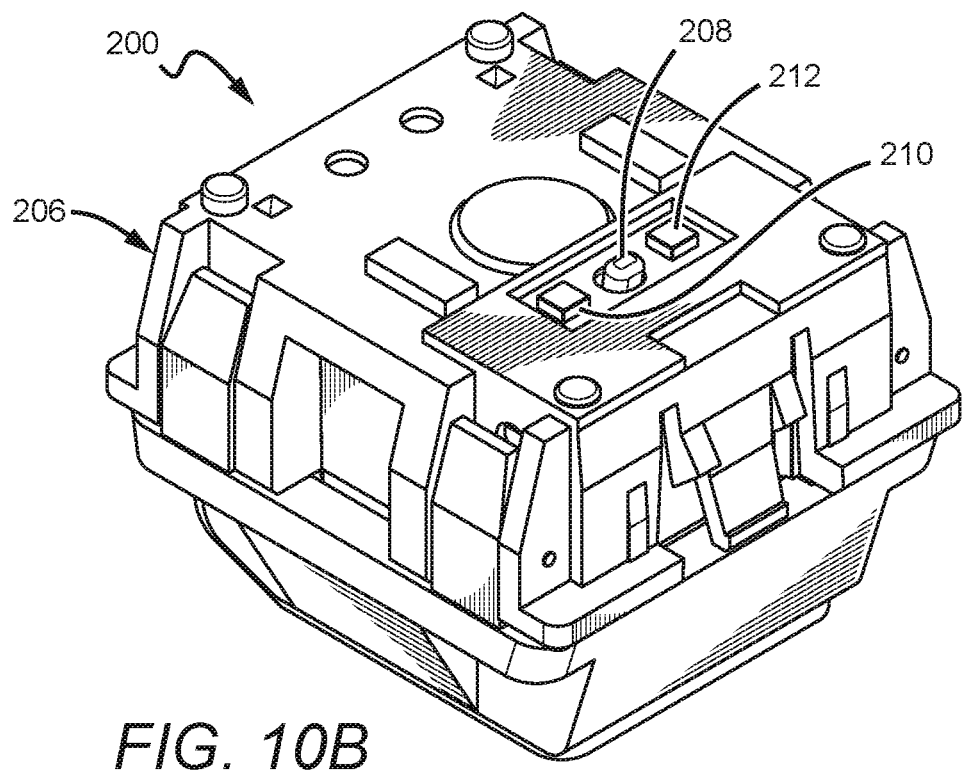
FIG. 10B shows a bottom perspective view of an optically switched embodiment with the plunger depressed.

FIGS. 10A and 10B show how emitter 210 along with receiver 212 work together with actuator 208 to detect each key press. FIG. 11 shows the bottom side of key switch 200 with plunger 202 undepressed. When plunger 202 is undepressed, actuator 208 retracts such that emitter 210 can emit radiation toward receiver 212. If receiver 212 detects an emission from emitter 210, a signal can be generated (or absence of signal can arise) and sent to a computer (or another electronic device configured to interpret such a signal or absence of signal), which can in turn be configured to interpret that signal as indicating the key is undepressed.

When plunger 202 is depressed, as shown in FIG. 10B, actuator 208 extends past a bottom surface of the lower casing 206, this placing an end of actuator 208 between emitter 210 and receiver 212. By coming between emitter 210 and receiver 212, actuator 208 causes the generation of a signal (or causes the absence of a signal), that can be interpreted by a computer (or other computing device) as a key press. As mentioned above, either of emitter 210 or receiver 212 can instead be an emitter/receiver package. In such embodiments, when actuator 208 extends below a bottom surface of the lower casing 206, the emitter/receiver package detects its own emission reflected to it, which can create a signal (or, e.g., an absence of signal) indicating a key press. Key switch 200 eliminates the need for membrane switches below each key switch, which eliminates failure related to membrane wear and tear.

Figure 11A:
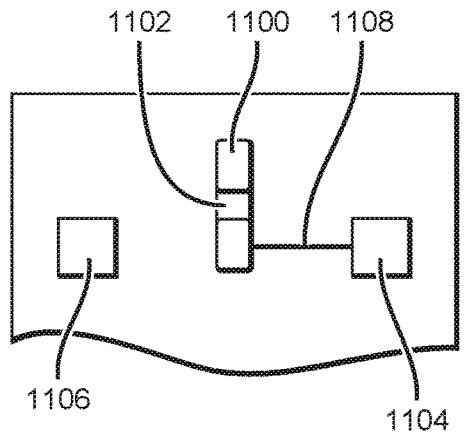
FIG. 11A shows a cross-section of an optical switching element in an undepressed configuration.
Figure 11B:
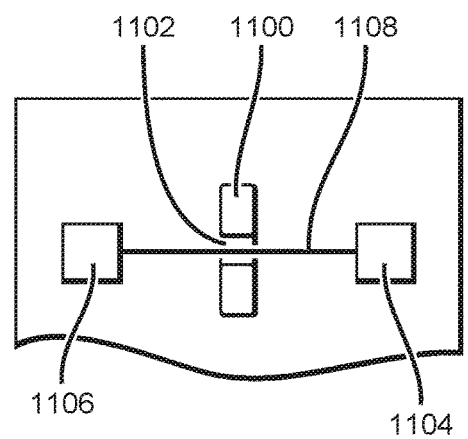
FIG. 11B shows a cross-section of an optical switching element in a depressed configuration.

In some embodiments, instead of having an actuator extend downward upon key press to interrupt a line of sight between an emitter/detector pair, the actuator can feature a through hole where, upon depressing an associated plunger, the actuator moves down such that the through hole moves between the emitter and detector to create a line of sight, thereby triggering detection of a key press. FIG. 11A shows a simplified view of an actuator 1100 having a through hole 1102 where a plunger associated with actuator 1100 is undepressed and light cannot travel from emitter 1104 to detector 1106. Line 1108 represents light emitted from emitter 1104, and, as shown in FIG. 11B, light emitted from emitter 1104 can only reach detector 1106 when the plunger associated with actuator 1100 is depressed. This actuator configuration can be implemented in any optically switched embodiment described in this application.

Figure 12:
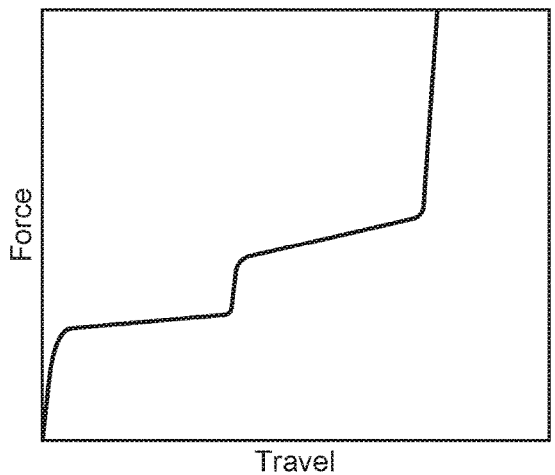
FIG. 12 is a graph of force versus travel for an ordinary membrane key switch.

Put together, embodiments of the inventive subject matter—whether implementing membrane switches or optical switches—produce a force response like that of a key switch from a mechanical keyboard while maintaining advantages conferred by traditional membrane-based key switches and optically triggered key switches. For example, FIG. 12 shows a graph of force versus travel for an ordinary key having a membrane switch, where force is the reaction force against a user's finger upon pressing a key, and travel is measured by how far a key is pressed downward from its initial position. For an ordinary membrane key switch (e.g., not one of the embodiments described in this application), a step up in force occurs as the key contacts and subsequently actuates the membrane switch. That is followed up a slightly steeper force response as the key presses against both a spring and the membrane switch. This results in a distinct feel under the user's finger that is distinguishable from and inferior to the feel of a mechanical key switch. The feel of such a key switch is typically associated with lower cost and lower quality keyboards. Finally, the tail end of the graph shows a large increase in force as the key is fully depressed. The membrane bears the brunt of that force increase, which can result in damage to the membrane. Embodiments of the inventive subject matter prevent this while improving force response.

Figure 13:
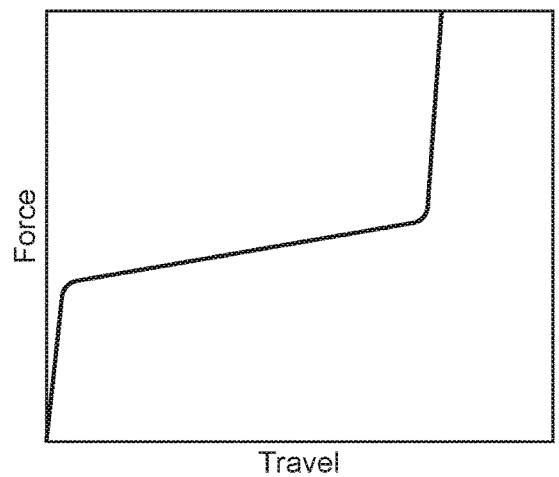
FIG. 13 is a graph of force versus travel for a key switch of the inventive subject matter.

FIG. 13 shows a similar force versus travel graph for a key switch of the inventive subject matter (either implementing a membrane switch or an optical switch). There is an initial jump in force response as the key is pressed from rest, then the graph shows a linear increase in force response that is attributable the linear relationship between force and change in position for ordinary springs. Switches that exhibit this kind of behavior are referred to as "linear switches" and are desirable among, e.g., keyboard enthusiasts and gamers. In this case, that relationship is defined by spring 136. In some embodiments, spring 136 can be made from, e.g., a shape memory alloy to create a key switch having a nearly flat force response as a key is depressed. Once a key switch bottoms out (e.g., it is fully depressed), there is an increase in force as shown at the end of FIG. 13 caused by the plunger reaching the limits of its mobility as defined by the lower casing. In some cases that means force applied by a user's finger is applied directly to the membrane, and when the membrane bottoms out, the user's finger causes a resulting spike in pressure applied to the membrane. In cases of key switches of the inventive subject matter configured to actuate a membrane switch, this resulting increase in force is not applied directly to a membrane switch, resulting in reduced wear and tear. The membrane switch is instead subject to a consistent force no matter how hard a key switch is depressed by a user because force applied to the rocker is defined by the spring between the rocker and the lower casing.

Thus, specific systems and devices relating to key switches have been disclosed. It should be apparent to those skilled in the art that many more modifications besides those already described are possible without departing from the inventive concepts in this application. The inventive subject matter, therefore, is not to be restricted except in the spirit of the disclosure. Moreover, in interpreting the disclosure all terms should be interpreted in the broadest possible manner consistent with the context. In particular the terms "comprises" and "comprising" should be interpreted as referring to the elements, components, or steps in a non-exclusive manner, indicating that the referenced elements, components, or steps can be present, or utilized, or combined with other elements, components, or steps that are not expressly referenced.

What is claimed is:

1. A key switch comprising:
   a lower casing having an actuator hole through a bottom portion;
   an optical emitter and an optical receiver disposed on either side of the actuator hole;
   an upper casing having a plunger hole through a top portion and configured to couple with the lower casing to form an interior space;
   a plunger comprising a sloped surface, wherein the plunger movably couples with the lower casing;
   a rocker disposed within the interior space;
   wherein the rocker comprises a first pivot point and a second pivot point, the first pivot point coupling with a first side of the lower casing and the second pivot point coupling with a second side of the lower casing;
   wherein the rocker further comprises a hammer disposed on a first portion of the rocker and an actuator disposed on a second portion of the rocker;
   wherein the first portion of the rocker exists on a first side of the first and second pivot points, and wherein the second portion of the rocker exists on a second side of the first and second pivot points;
   a spring disposed between the lower casing and the first portion of the rocker;
   wherein the spring is configured to press the hammer against the sloped surface; and
   wherein, upon depressing the plunger at least partially into the interior space, the rocker is configured to rotate about the first and second pivot points based on the hammer sliding along the sloped surface causing the actuator to come between the optical emitter and the optical receiver.

2. The key switch of claim 1, wherein the actuator extends through the actuator hole upon depressing the plunger.

3. The key switch of claim 1, wherein the plunger comprises an upper portion having a cross-shaped cross section to facilitate coupling a key cap thereto.

4. The key switch of claim 1, wherein the plunger comprises a piston and the lower casing comprises a piston cavity, and wherein the piston is configured to fit at least partially within the piston cavity such that the piston cavity acts as a guide for the piston's movement.

5. The key switch of claim 4, further comprising a second spring disposed between the lower casing and the plunger, wherein the piston and the piston cavity are disposed at least partially within an interior portion of the second spring.

6. The key switch of claim 5, wherein the second spring creates a first reaction force that is approximately orthogonal to a second reaction force created by the first spring.

7. The key switch of claim 1, wherein the spring directly contacts the lower casing.

8. The key switch of claim 1, wherein, upon depressing the plunger at least partially into the interior space, the rocker is configured to rotate about the first and second pivot points based on the hammer sliding along the sloped surface causing the actuator to come between the optical emitter and the optical receiver and interrupt a line of sight between the optical emitter and the optical receiver.

9. The key switch of claim 1, wherein the actuator comprises a through hole, and
wherein, upon depressing the plunger at least partially into the interior space, the rocker is configured to rotate about the first and second pivot points based on the hammer sliding along the sloped surface causing the through hole of the actuator to come between the optical emitter and the optical receiver to create a line of sight between the optical emitter and the optical receiver.

10. The key switch of claim 1, wherein the key switch is a linear switch.

11. A key switch comprising:
a casing having an actuator hole through a bottom surface;
an optical emitter and an optical receiver disposed on either side of the actuator hole;
a plunger comprising a sloped surface, wherein the plunger movably couples with the casing;
a rocker at least partially disposed within the casing;
wherein the rocker comprises a hammer disposed on a first portion of the rocker and an actuator disposed on a second portion of the rocker;
a spring disposed between the casing and the first portion of the rocker;
wherein the spring is configured to press the hammer against the sloped surface; and
wherein, upon depressing the plunger, the rocker is configured to rotate based on an interaction of the hammer with the sloped surface causing the actuator to come between the optical emitter and the optical receiver.

12. The key switch of claim 11, wherein the actuator extends through the actuator hole upon depressing the plunger.

13. The key switch of claim 11, wherein the plunger comprises an upper portion having a cross-shaped cross section to facilitate coupling a key cap thereto.

14. The key switch of claim 11, wherein the plunger comprises a piston and the casing comprises a piston cavity, and wherein the piston is configured to fit at least partially within the piston cavity such that the piston cavity acts as a guide for the piston's movement.

15. The key switch of claim 14, further comprising a second spring disposed between the casing and the plunger, wherein the piston and the piston cavity are disposed at least partially within an interior portion of the second spring.

16. The key switch of claim 15, wherein the second spring creates a first reaction force that is approximately orthogonal to a second reaction force created by the first spring.

17. The key switch of claim 11, wherein the spring directly contacts the casing.

18. The key switch of claim 11, wherein, upon depressing the plunger, the rocker is configured to rotate based on the interaction of the hammer with the sloped surface causing the actuator to come between the optical emitter and the optical receiver and interrupt a line of sight between the optical emitter and the optical receiver.

19. The key switch of claim 11, wherein the actuator comprises a through hole, and
wherein, upon depressing the plunger, the rocker is configured to rotate based on the interaction of the hammer with the sloped surface causing the through hole of the actuator to come between the optical emitter and the optical receiver and create a line of sight between the optical emitter and the optical receiver.

20. The key switch of claim 6, wherein the key switch is a linear switch.

* * * * *